United States Patent [19]
Mitzlaff

[11] Patent Number: 5,307,512
[45] Date of Patent: Apr. 26, 1994

[54] POWER CONTROL CIRCUITRY FOR ACHIEVING WIDE DYNAMIC RANGE IN A TRANSMITTER

[75] Inventor: James E. Mitzlaff, Arlington Heights, Ill.

[73] Assignee: Motorola, Inc., Schaumburg, Ill.

[21] Appl. No.: 709,459

[22] Filed: Jun. 3, 1991

[51] Int. Cl.$^5$ .............................................. H04B 1/04
[52] U.S. Cl. ................................. 455/126; 455/127; 330/144; 330/284
[58] Field of Search ............... 455/126, 127, 67.1, 455/102, 115, 118, 52.1; 330/144, 279, 284

[56] References Cited

U.S. PATENT DOCUMENTS

| | | | |
|---|---|---|---|
| 3,828,270 | 8/1974 | Ebisch | 330/130 |
| 4,004,224 | 1/1977 | Arens et al. | 455/52.1 |
| 4,317,083 | 2/1982 | Boyd | 455/127 |
| 4,523,155 | 6/1985 | Walczak et al. | 330/279 |
| 4,602,218 | 7/1986 | Vilmur et al. | 330/279 |
| 4,630,117 | 12/1986 | Parker | 455/246.1 |
| 4,709,404 | 11/1987 | Tamura et al. | 455/126 |
| 4,803,440 | 2/1989 | Hotta et al. | 330/145 |

FOREIGN PATENT DOCUMENTS 388894 9/1990 European Pat. Off. ............ 455/127

OTHER PUBLICATIONS

Hewlett/Packard, "8656A Signal Generator 0.1–990 MHz", Operating and Service Manual, Part No. 08656-90107, printed May 1981, for Hewlett/packard, 1501 Page Mill Rd., Palo Alto, Calif.
R. L. Drake Company, "Model 2-B Receiver"—described on pp. 16 and 18.

*Primary Examiner*—Reinhard J. Eisenzopf
*Assistant Examiner*—Edward Urban
*Attorney, Agent, or Firm*—Richard A. Sonnentag

[57] ABSTRACT

Power control circuitry (100) uses two attenuators in the transmit path to achieve wide dynamic range. An intermediate frequency (IF) attenuator (200) is placed before a mixer (212) in the IF section of the transmit path and a radio frequency (RF) attenuator (221) is placed after the mixer (212) in the RF section of the transmit path. Power control circuitry (236) controls setting of the two attenuators in response to a magnitude control signal (102) related to a RF output signal at a desired power level. To conserve battery power of the subscriber unit, only the RF attenuator (221) is adjusted when the desired power level is to be within a given range below the maximum transmission level. For ranges below the given range, the RF attenuator (221) is set for maximum attenuation and the IF attenuator (200) is adjusted.

28 Claims, 2 Drawing Sheets

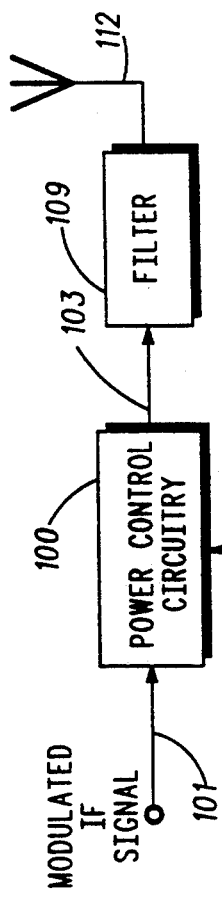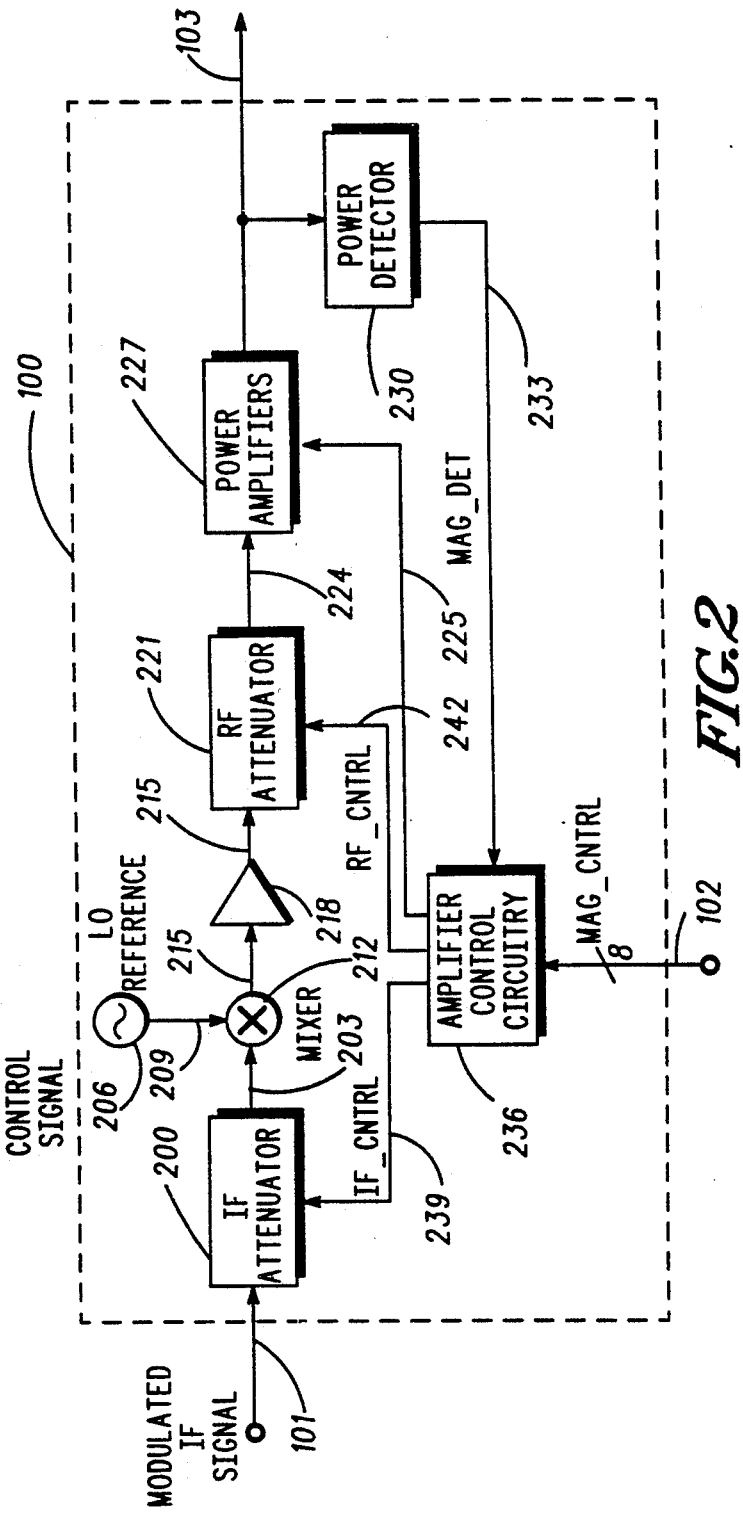

POWER CONTROL CIRCUITRY FOR ACHIEVING WIDE DYNAMIC RANGE IN A TRANSMITTER

FIELD OF THE INVENTION

The present invention is generally related to transmitters in radiotelephones, and more specifically, related to power control circuitry that may be advantageously used in transmitters for radiotelephones.

BACKGROUND OF THE INVENTION

Cellular telephones currently continuously transmit during a telephone call. In a typical scenario, a subscriber unit moves throughout a cell while constantly maintaining communication with a base station located approximately in the center of the cell. As the subscriber unit moves throughout the cell, the received signal strength indication (RSSI) as seen by the base station, varies significantly. This variance has the potential to overload the receiver in the base station when the subscriber unit is very close to the base station.

As personal communication networks (PCN) and code division multiple access (CDMA) type cellular systems evolve, the dynamic range requirements on transmitters becomes more stringent. To avoid overloading of the base station receiver when a subscriber unit is very close to the base station, the subscriber unit must have a typical dynamic range upwards to approximately 80 dB. All current approaches to PA power control, however, are limited to around 40 dB dynamic range because stray RF coupling limits the amount of attenuation that can be achieved to about that level. Stray radiation also becomes a problem when attenuation levels between 40-80 dB are attempted.

Thus, a need exists for power control circuitry which achieves a wide dynamic range while overcoming the problems of stray RF coupling and stray radiation.

SUMMARY OF THE INVENTION

Control circuitry adjusts the level of an output signal. The control circuitry adjusts a priori the level of a signal having a first frequency to produce an adjusted signal having a first frequency, translates the adjusted signal having a first frequency to a translated signal having a second frequency, and adjusts a priori the level of the translated signal having a second frequency to produce the adjusted output signal having a second frequency.

BRIEF DESCRIPTION OF THE DRAWINGS

FIG. 1 is a block diagram generally illustrating a RF signal power amplifier employing power control circuitry in accordance with the invention.

FIG. 2 is a block diagram of the power control circuitry in accordance with the invention.

DETAILED DESCRIPTION OF A PREFERRED EMBODIMENT

Figure 3:
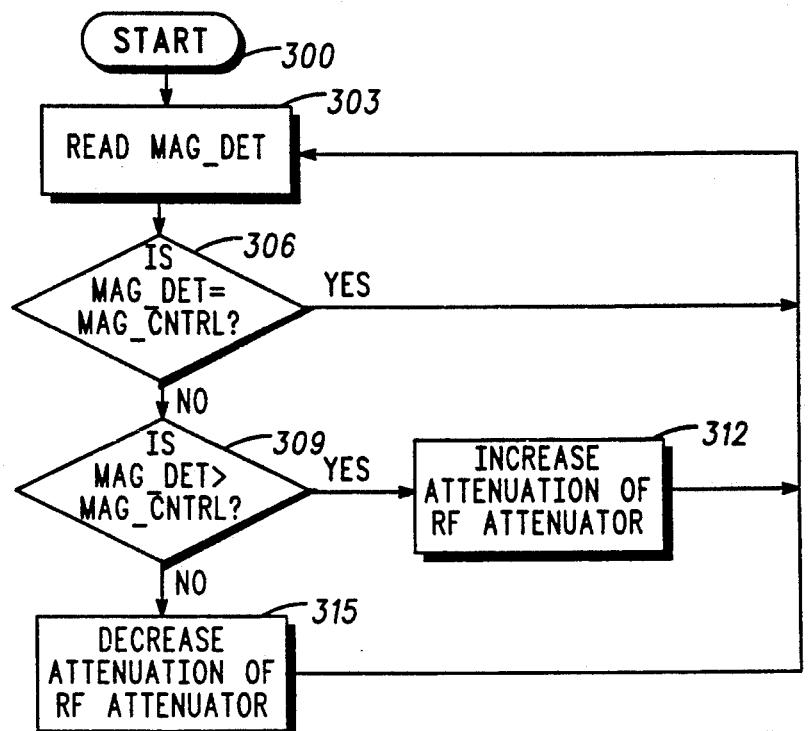
FIG. 3 is a flow chart for the process used by amplifier control circuitry 236 to set RF attenuator 221 in FIG. 2.

FIG. 1 illustrates a RF signal power amplifier which may advantageously employ the present invention. A RF signal power amplifier is typically part of a radio transmitter, such as that described in Motorola Instruction Manual No. 68P81039E25, entitled, "Advanced Mobile Phone System", and published by Motorola Service Publications, 1301 E. Algonquin Rd., Schaumburg, Ill. 1979. The RF signal power amplifier in FIG. 1 includes power control circuitry 100 which accepts a modulated IF signal 101, upconverts the IF signal 101 to a RF output signal 103 and adjusts the IF signal 101 and the RF output signal 103 proportional to a magnitude control signal, MAG_CNTRL 102. In the preferred embodiment, MAG_CNTRL 102 is an 8-bit digital word used to represent the desired RF output signal at a particular power level. In alternate embodiments, the number of bits in the digital word may vary depending on the number of transmission levels the system requires. Output from the power control circuitry 100 is RF output signal 103 having a desired power level related to the magnitude control signal. The RF output signal is coupled via a filter 109 to an antenna 112. The output power level developed by the power control circuitry 100 typically amplifies the input signal 101 from approximately one milliwatt to 5 or more watts.

FIG. 2 depicts further detail of the power control circuitry 100 in accordance with the invention. FIG. 2 consists of an IF attenuator 200, a mixer 212, a filter and buffer amplifier 218, a RF attenuator 221, power amplifiers (PA's) 227, a power detector 230 and amplifier control circuitry 236. A modulated IF signal 101 enters IF attenuator 200 and is attenuated by an amount dependent on the value of a first adjustment control signal, IF_CNTRL 239. In the preferred embodiment, IF attenuator 200 is a balanced mixer type attenuator PAS-3 manufactured by Mini-Circuits and is used to adjust the level of the IF signal 101. In alternate embodiments, IF attenuator may be realized by employing PIN diode attenuators or gain controllable amplifiers, such as a Hewlett-Packard HPVA-0180 gain controllable amplifier. Output from IF attenuator 200 is an adjusted IF signal 203 which then enters a mixer 212. The mixer 212 can be any conventional mixer circuit, such as a double balanced, diode type mixer or balanced Gilbert Cell type active mixer to minimize local oscillator (LO) feedthrough and is used to translate the adjusted IF signal 203 to a RF signal 215. The mixer 212 also has as an input a reference signal 209 which is generated by the LO reference 206. Output from the mixer 212 is a RF signal 215 which is then filtered and buffered by filter and buffer amplifier 218. The filter and buffer amplifier 218 are required to remove spurious components from the mixer output and build up the signal to the levels needed to drive subsequent stages. Continuing, the RF signal 215 enters a second attenuator, RF attenuator 221. In the preferred embodiment, RF attenuator 221 is a balanced mixer type attenuator PAS-2 manufactured by Mini-Circuits and is used to adjust the level of the RF signal 215. The RF signal 215 is attenuated by an amount depending on the value of a second attenuation control signal, RF_CNTRL 242. Output from the RF attenuators 221 is an adjusted RF signal 224 which is amplified by power amplifiers 227 to produce the desired RF output signal. The power amplifiers 227 may be any conventional class A, AB, or B power amplifiers which may be driven into saturation for higher efficiency when constant envelope modulation schemes (such as FM) are employed. A power detector 230 detects the magnitude of the desired RF output signal and produces a magnitude detection signal, MAG_DET 233. The power detector may be any conventional power detector such as diode type detectors or logarithmic amplifier/detector circuitry. Amplifier control circuitry 236 accepts MAG_DET 233, and also MAG_CNTRL 102. Amplifier control circuitry 236 determines IF_CNTRL 239 and RF_CNTRL 242 relative to the difference between MAG_DET 233 and MAG_CNTRL 102.

Amplifier control circuitry 236 is at the heart of the power control circuitry 100 and is unique in that it must control two outputs instead of just one. In the preferred embodiment, a microprocessor, such as a Motorola 68HC11, could be used to digitally control IF attenuator 200 and RF attenuator 221. Digital-to-analog (D/A) converters can be used on each output as required to provide IF_CNTRL 239 and RF_CNTRL 242 in analog form. As digitally controlled attenuators become more commonplace, the D/A converters will not be required. Likewise, in an alternate embodiment, an A/D converter can be used to digitize the output of the power detector 230. In this embodiment MAG_DET 233 would be a digital representation of the desired RF output signal.

Control of IF attenuator 200 and RF attenuator 221 is accomplished as follows. Amplifier control circuitry 236 would allow the desired RF output signal 103 to be within a predetermined power level range or dynamic range, which for purposes of example, might be 80 dB. An adjustment power level range, which is less than the 80 dB dynamic range, is programmed into the microprocessor of amplifier control circuitry 236. This range, again for example purposes, may be anywhere between 0 and 40 dB below the maximum available power level. If the desired RF output signal is to be within this smaller range, only RF attenuator 221 is adjusted. If MAG_CNTRL 102 entering amplifier control circuitry 236 indicates that the subscriber unit must transmit within this 0 to 40 dB range below the maximum, IF attenuator 200 is set for maximum output and a control loop is invoked. FIG. 3 depicts the steps amplifier control circuitry 236 undergoes to set RF attenuator 221 during this process. The process starts at 300 when amplifier control circuitry 236 reads at 303 MAG_DET 233. A test is then performed to determine if MAG_DET 233 is equivalent to MAG_CNTRL 102. If it is, amplifier control circuitry 236 will again read at 303 MAG_DET 233. If MAG_DET 233 is not equivalent to MAG_CNTRL 102, another test is performed at 309 to determine if MAG_DET 233 is greater than MAG_CNTRL 102. If it is, the desired RF output signal 103 is too high and must be attenuated. This is accomplished by amplifier control circuitry 236 by increasing at 312 the amount of attenuation of RF attenuator 221. After the attenuation is increased, amplifier control circuitry 236 will again read at 303 MAG_DET 233. If MAG_DET 233 is not greater than MAG_CNTRL 102, the desired RF output signal 103 is below the level required by MAG_CNTRL 102, and consequently amplifier control circuitry 236 decreases at 315 the attenuation of RF attenuator 221. Again, after the attenuation has been decreased, amplifier control circuitry 236 reads at 303 MAG_DET 233 to determine if the level is as desired.

As long as MAG_CNTRL 102 requests the subscriber to transmit within 40 dB of the maximum (the adjustment power level range), RF attenuator 221 is the only attenuator which is adjusted. This is important for subscriber units which run off of battery power, since less current is used in switching only one of the two available attenuators. Another important reason for controlling RF attenuator 221 at the higher power levels is to minimize power consumed by the PA's 227, which is often directly proportional to PA input/output power. In addition, the current supplied to PA's 227 when higher power levels are required is varied as a function of the required output level. To optimize PA efficiency throughout the adjustment power level range, bias control signal 225 from amplifier control circuitry 236 to the PA's 227 is varied to control PA idle current for Class A and AB PA's. Amplifier control circuitry 236 monitors MAG_CNTRL 102, and when MAG_CNTRL 102 is within the aforementioned adjustment power level range, amplifier control circuitry 236 will set the bias control signal 225 to a predetermined level so as to limit PA current to the minimum level needed to produce the required output power.

When the transmission level is required to be the below the adjustment power level range, amplifier control circuitry 236 will reduce the current supplied to the PA's 227 to a minimum current required to maintain transmission at the required output power level. This output power level, and its corresponding minimum current level, occurs at the bottom of the adjustment power level range. Also at this time, RF attenuator 221 is set to maximum attenuation and IF attenuator 200 is then adjusted to provide for further reductions in RF output power. Use of two attenuators in the transmit path, where the signals attenuated are at different frequencies, allows for the wide dynamic range of the transmitter. The major drawback of single attenuator transmitter paths is that the attenuation is limited to around 40 dB of control range due to stray coupling around the attenuator itself. That is, even though the path through the attenuator can be cutoff completely, some amount of signal always leaks around the attenuator and into succeeding amplifier stages. Two attenuators in the transmit path, where the signals are at different frequencies, avoid the stray coupling problem since the IF signal will not propagate through the RF circuitry, even if there is some IF signal leakage. Attenuating at both IF and RF also minimizes stray radiation, since the level of transmit frequency signal present inside the subscriber unit is greatly reduced.

If the power detector 230 has approximately 80 dB of dynamic range, then a similar feedback loop as that described in FIG. 3 for adjusting IF attenuator 200 through IF_CNTRL 239, could be used for ranges between 40 to 80 dB below the maximum power level. In the preferred embodiment, since detector range is usually limited to below 80 dB, an incremental control scheme using a linear IF attenuator 200 may be incorporated. In the linear IF attenuator 200, the attenuation is "calibrated" so that a given step in IF_CNTRL 239 say 1 V, produces a constant change in power, like 10 dB.

Figure 4:
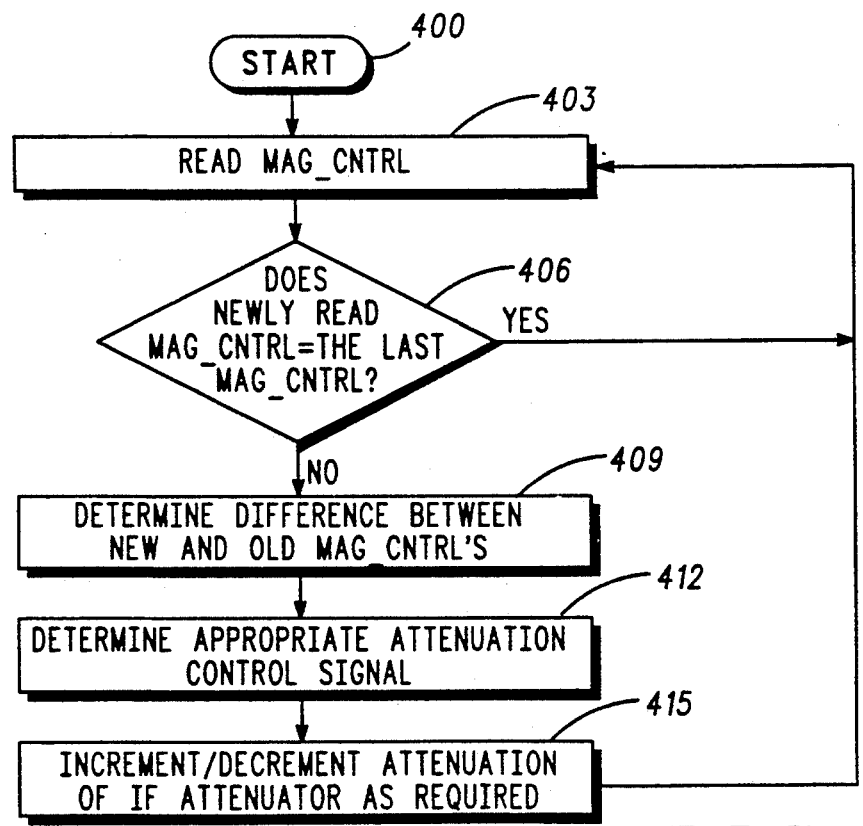
FIG. 4 is a flow chart for the process used by amplifier control circuitry 236 to set IF attenuator 200 in FIG. 2.

FIG. 4 depicts the steps amplifier control circuitry 236 would undergo to perform the incremental control scheme. The process starts at 400 when amplifier control circuitry 236 reads at 403 MAG_CNTRL 102. A test is then performed at 406 to determine if the newly read MAG_CNTRL 102 is equal to the last magnitude control signal. If it is, IF attenuator 200 does not need to be adjusted and amplifier control circuitry 236 will read at 403 the next MAG_CNTRL 102. If, however, the newly read MAG_CNTRL 102 is not equal to the last MAG_CNTRL 102, amplifier control circuitry 236 will determine at 409 the difference between the new and the old MAG_CNTRL's. Amplifier control circuitry 236 then determines at 412 the appropriate IF_CNTRL 239 to be applied to IF attenuator 200. IF attenuator 200 then has its attenuation incremented/-decremented at 415 as required. After the attenuation has been incremented/decremented, a new MAG_CNTRL 102 is read at 403 by amplifier control circuitry 236 and the process is repeated.

Thus, needs have been substantially met for power control circuitry which provides wide dynamic range for use in radiotelephone systems where overloading of a base-station receiver must be avoided. The use of an attenuator in the IF branch and an attenuator in the RF branch reduces the affects of stray coupling around the attenuators to effectively increase the dynamic range of the transmitter. This two stage control scheme also provides for improved efficiency by enabling the PA's 227 current to be cut back as the RF output power level is reduced.

What I claim is:

1. Control circuitry for adjusting the level of an output signal comprising:
    first means for adjusting a priori the level of a signal having a first frequency to produce an adjusted signal having a first frequency;
    means, coupled to said first means for adjusting, for translating said adjusted signal having a first frequency to a translated signal having a second frequency;
    second means, coupled to said means for translating, for adjusting a priori the level of said translated signal having a second frequency to produce the adjusted output signal having a second frequency;
    means, coupled to said second means for adjusting, for amplifying said adjusted output signal having a second frequency to produce an amplified adjusted output signal having a second frequency;
    means, coupled to said means for amplifying, for detecting a magnitude of said amplified adjusted output signal having a second frequency to produce a magnitude detection signal; and
    means for controlling said first and second means for adjusting and said means for amplifying based on input from at least said magnitude detection signal and an adjustment control signal.

2. The control circuitry of claim 1 wherein said first means for adjusting further comprises means for attenuating the level of said signal having a first frequency.

3. The control circuitry of claim 1 wherein said first means for adjusting further comprises means for variably amplifying the level of said signal having a first frequency.

4. The control circuitry of claim 1 wherein said second means for adjusting further comprises means for attenuating the level of said translated signal having a second frequency.

5. The control circuitry of claim 1 wherein said second means for adjusting further comprises means for variably amplifying the level of said translated signal having a second frequency.

6. The control circuitry of claim 1 wherein said means for translating further comprises means for generating a reference signal having a third frequency.

7. The control circuitry of claim 6 wherein said means for translating further comprises means for mixing said adjusted signal having a first frequency with said reference signal having a third frequency to produce said translated signal having a second frequency.

8. Power control circuitry for adjusting the power level of a radio frequency (RF) output signal, the power control circuitry having as input an intermediate frequency (IF) signal from a signal source, the power control circuitry comprising:
    first means for adjusting a priori the power level of the IF signal to produce an adjusted IF signal;
    means, coupled to said first means for adjusting, for translating said adjusted IF signal to the RF output signal;
    second means, coupled to said means for translating, for adjusting a priori the power level of said RF output signal to produce an adjusted RF output signal;
    means, coupled to said second means for adjusting, for amplifying said adjusted RF output signal to produce an amplified adjusted RF output signal;
    means, coupled to said means for amplifying, for detecting a magnitude of said amplified adjusted RF output signal to produce a magnitude detection signal; and
    means for controlling said first and second means for adjusting and said means for amplifying based on input from at least said magnitude detection signal and an adjustment control signal.

9. The power control circuitry of claim 8 wherein said means for translating further comprises means for generating a reference signal.

10. The power control circuitry of claim 9 wherein said means for translating further comprises means for mixing said adjusted IF signal with said reference signal to produce said RF output signal.

11. Power control circuitry for adjusting the power level of a radio frequency (RF) output signal over a predetermined power level range in a transmitter, the power control circuitry having as input an intermediate frequency (IF) signal from a signal source, the power control circuitry having the capability to adjust the RF output signal to a desired level and provide at least one adjustment control signal related to the RF output signal at a desired power level, the power control circuitry comprising:
    means for providing an adjustment power level range less than or equal to the predetermined power level range;
    means for generating a reference signal;
    means for detecting a magnitude level of the RF output signal to produce a magnitude detection signal;
    means for providing first and second adjustment control signals from the difference between the magnitude detection signal and a magnitude control signal;
    first means, responsive to the first adjustment control signal, for adjusting the IF signal when the desired power level of the RF output signal is not within said adjustment power level range;
    means, coupled to said first means for adjusting, for mixing said generated reference signal with said adjusted IF signal to produce the RF output signal; and
    second means, responsive to the second adjustment control signal, for adjusting said RF output signal when said desired power level of said RF output signal is within said adjustment power level range to produce the RF output signal at the desired power level.

12. The power control circuitry of claim 11 wherein said first means for adjusting further comprises means for attenuating the power level of said IF signal when the desired power level of the RF output signal is not within said adjustment power level range.

13. The power control circuitry of claim 11 wherein said second means for adjusting further comprises means for attenuating the power level of said RF output signal when said desired power level of said RF output signal is within said adjustment power level range.

14. The power control circuitry of claim 11 wherein said second means for adjusting further comprises means for variably amplifying the power level of said RF output signal when said desired power level of said RF output signal is within said adjustment power level range.

15. A method of adjusting the level of an output signal comprising the steps of:
  adjusting a priori the level of a signal having a first frequency to produce an adjusted signal having a first frequency;
  translating said adjusted signal having a first frequency to a translated signal having a second frequency;
  adjusting a priori the level of said translated signal having a second frequency to produce the adjusted output signal having a second frequency;
  amplifying said adjusted output signal having a second frequency to produce an amplified adjusted output signal having a second frequency;
  detecting a magnitude of said amplified adjusted output signal having a second frequency to produce a magnitude detection signal; and
  controlling said steps of adjusting and said step of amplifying based on input from at least said magnitude detection signal and an adjustment control signal.

16. The method of claim 15 wherein said step of adjusting the level of a signal having a first frequency further comprises the step of attenuating the level of said signal having a first frequency.

17. The method of claim 15 wherein said step of adjusting the level of a signal having a first frequency further comprises the step of variably amplifying the level of said signal having a first frequency.

18. The method of claim 15 wherein said step of adjusting the level of said translated signal having a second frequency further comprises the step of attenuating the level of said translated signal having a second frequency.

19. The method of claim 15 wherein said step of adjusting the level of said translated signal having a second frequency further comprises the step of variably amplifying the level of said translated signal having a second frequency.

20. The method of claim 15 wherein said step of translating further comprises the step of generating a reference signal having a third frequency.

21. The method of claim 20 wherein said step of translating further comprises the step of mixing said adjusted signal having a first frequency with said reference signal having a third frequency to produce said translated signal having a second frequency.

22. A method of adjusting the power level of a radio frequency (RF) output signal, the method comprising the steps of:
  adjusting a priori the power level of an IF signal to produce an adjusted IF signal;
  translating said adjusted IF signal to a RF output signal;
  adjusting a priori the power level of said RF output signal to produce an adjusted RF output signal;
  amplifying said adjusted RF output signal to produce an amplified adjusted RF output signal;
  detecting a magnitude of said amplified adjusted RF output signal to produce a magnitude detection signal; and
  controlling said steps of adjusting and said step of amplifying based on input from at least said magnitude detection signal and an adjustment control signal.

23. The method of claim 22 wherein said step of translating further comprises the step of generating a reference signal.

24. The method of claim 23 wherein said step of translating further comprises the step of mixing said adjusted IF signal with said reference signal to produce said RF output signal.

25. A method of adjusting the power level of a radio frequency (RF) output signal over a predetermined power level range in a transmitter incorporating power control circuitry, the power control circuitry having as input an intermediate frequency (IF) signal from a signal source, the power control circuitry having the capability to adjust the RF output signal to a desired level and provide at least one adjustment control signal related to the RF output signal at a desired power level, the method comprising the steps of:
  providing an adjustment power level range less than or equal to the predetermined power level range;
  generating a reference signal;
  detecting a magnitude level of the RF output signal to produce a magnitude detection signal;
  providing first and second adjustment control signals from the difference between the magnitude detection signal and a magnitude control signal;
  adjusting, based on the first adjustment control signal, the IF signal when the desired power level of the RF output signal is not within said adjustment power level range;
  mixing said generated reference signal with said adjusted IF signal to produce the RF output signal; and
  adjusting, based on the second adjustment control signal, said RF output signal when said desired power level of said RF output signal is within said adjustment power level range to produce the RF output signal at the desired power level.

26. The method of claim 25 wherein said step of adjusting the IF signal further comprises the step of attenuating the power level of said IF signal when the desired power level of the RF output signal is not within said adjustment power level range.

27. The method of claim 25 wherein said step of adjusting said RF output signal further comprises the step of attenuating the power level of said RF output signal when said desired power level of said RF output signal is within said adjustment power level range.

28. The method of claim 25 further comprising the steps of:
  amplifying said RF output signal at a desired level; and
  varying a current supplied at said step of amplifying when the desired power level of the RF output signal is within said adjustment power level range.

* * * * *